(12) United States Patent
Chang

(10) Patent No.: US 7,851,862 B2
(45) Date of Patent: Dec. 14, 2010

(54) METHOD AND RESULTANT STRUCTURE FOR FLOATING BODY MEMORY ON BULK WAFER

(75) Inventor: Peter L. D. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/384,424

(22) Filed: Apr. 2, 2009

(65) Prior Publication Data

US 2009/0224358 A1 Sep. 10, 2009

(51) Int. Cl.
*H01L 27/01* (2006.01)
(52) U.S. Cl. ............... 257/353; 257/347; 257/E21.127; 438/164; 438/157; 438/479
(58) Field of Classification Search ................. 257/353, 257/347, E21.127; 438/164, 157, 479
See application file for complete search history.

(56) References Cited

U.S. PATENT DOCUMENTS

| | | | |
|---|---|---|---|
| 2003/0215988 A1* | 11/2003 | Zahurak et al. | 438/157 |
| 2004/0195610 A1* | 10/2004 | Morikado | 257/300 |
| 2007/0022941 A1* | 2/2007 | Park et al. | 117/3 |
| 2008/0112231 A1* | 5/2008 | Shum | 365/185.27 |

* cited by examiner

*Primary Examiner*—Tu-Tu V Ho
(74) *Attorney, Agent, or Firm*—Blakely, Sokoloff, Taylor & Zafman LLP

(57) ABSTRACT

A method for making floating body memory cells from a bulk substrate. A thin silicon germanium and overlying silicon layers are formed on the bulk substrate. Anchors and a bridge are formed to support the silicon layer when the silicon germanium layer is etched so that it can be replaced with an oxide.

4 Claims, 12 Drawing Sheets

METHOD AND RESULTANT STRUCTURE FOR FLOATING BODY MEMORY ON BULK WAFER

REFERENCE TO RELATED APPLICATION

This application claims priority to U.S. application Ser. No. 11/644,500, filed Dec. 22, 2006 now U.S. Pat. No. 7,531,879.

FIELD OF THE INVENTION

This invention relates to the field of integrated circuit memories, particularly those using transistors with floating bodies.

PRIOR AND RELATED ART

Most common dynamic random-access memory (DRAM) cells store charge on a capacitor and use a single transistor for accessing the capacitor. More recently, a cell has been proposed which stores charge in a floating body of a transistor. A back gate is biased to retain charge in the floating body.

In one proposal, an oxide layer is formed on a silicon substrate and a silicon layer for the active devices is formed on the oxide layer (SOI substrate). The floating bodies are defined from the silicon layer; the substrate is used as a back or biased gate. One problem with this arrangement is the relatively high voltage required on the back gate because of the thick oxide.

Several structures have been proposed to reduce the relatively high bias potential discussed above, including use of a double gate floating body and silicon pillars. These structures are difficult to fabricate. This and other related technology is described at C. Kuo, *IEDM*, December 2002, following M. Chan *Electron Device Letters*, January 1994; C. Kuo, *IEDM*, December 2002, *"A Hypothetical Construction of the Double Gate Floating Body Cell;"* T. Ohsawa, et al., *IEEE Journal of Solid-State Circuits*, Vol. 37, No. 11, November 2002; and David M. Fried, et al., *"Improved Independent Gate N type FinFET Fabrication and Characterization,"* IEEE Electron Device Letters, Vol. 24, No. 9, September 2003; *Highly Scalable FBC with 25 nm BOX Structure for Embedded DRAM Applications*, T. Shino, IDEM 2004, pgs 265-268; T. Shino, *IEDM 2004, "Fully-Depleted FBC (Floating Body Cell) with enlarged signal Window and excellent Logic Process Compatibility;"* T. Tanaka, IEDM 2004, *"Scalability Study on a Capacitorless 1T-DRAM: From Single-gate PD-SOI to Double-gate FinDRAM*; U.S. Pat. No. 7,049,654; and U.S. Pat. No. 7,498,211.

Another floating body memory formed on a bulk substrate is described in *Symposium on VLSI Technology Digest of Technical Papers*, page 38, 2005 by R. Ranica, et al. The floating p well, as described, is isolated from neighboring devices by a shallow trench isolation region and underlying n well.

A technique for using a silicon germanium (SiGe) layer to form a floating body is described in "Gate-Assisted SOI on Bulk Wafer and its Application to Floating Body Memory and Transistors," U.S. Patent Application 2008/0090348. The present application describes a simplified process for obtaining the floating bodies using a bulk wafer on a SiGe layer.

DETAILED DESCRIPTION

In the following description, a memory and method for fabricating the memory is described. Numerous specific details are set forth, such as specific conductivity types, to provide a thorough understanding of the present invention. It will be apparent to one skilled in the art, that the present invention may be practiced without these specific details. In other instances, well known processing steps have not been described in detail, in order not to unnecessarily obscure the present invention.

In the following description, anchors are formed into a substrate and bridges are formed between the anchors. The bridge structure is used to support a first semiconductor layer (e.g. silicon) so that an underlying second semiconductor layer (e.g. SiGe) may be etched away with a selective etchant. The resultant gap is backfilled with an oxide and forms the gate insulation for the back gate of a floating body cell (FBC).

Figure 1:
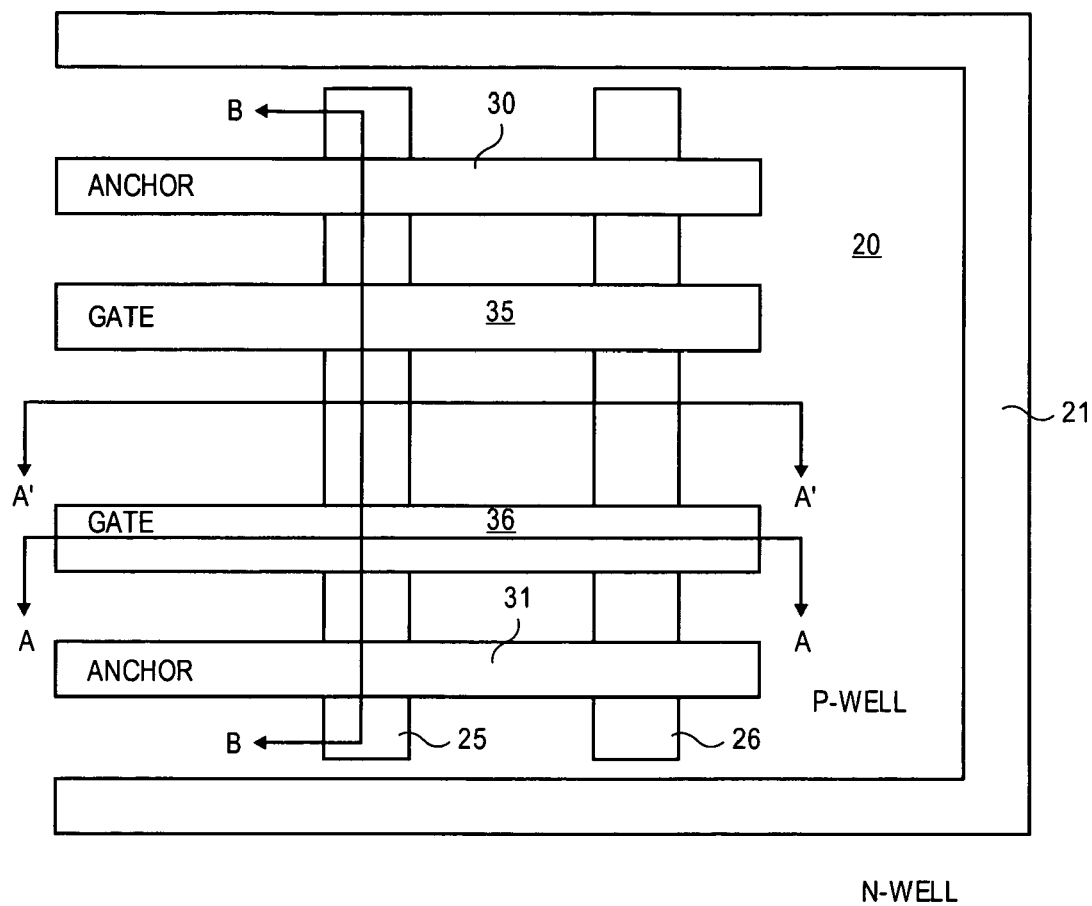
FIG. 1 is a plan view of a portion of a floating body memory array. This view is used, in part, to provide orientation for the elevation views which follow.

Referring to FIG. 1, in one embodiment the FBCs are formed in a p well 20 which itself is formed entirely within an n well of a bulk silicon substrate. The p well includes a p well tap 21 so that the p well can be biased to become the back gate of the FBCs. In FIG. 1, two anchors 30 and 31 are shown with gates 35 and 36 disposed between the anchors 30 and 31. The bodies for the FBCs are disposed perpendicular to the gate lines shown in FIG. 1, specifically, the bodies 25 and 26 which define diffusion lines for the FBCs are orthogonal to the gates (word lines) 35 and 36. Typically, two, three or even more gates are disposed between the anchors 30 and 31. The material used for the anchors and bridges, along with the gate lengths, are factors determining how many gates can be disposed between the anchors. The bridge, as described above, support the underlying silicon bodies 25 and 26 during processing, as will be seen. In some embodiments, isolation may be used between the gates 35 and 36. As will be seen below in one embodiment, the anchors 30 and 31 become isolation regions themselves after their use as anchors.

The described process and resultant FBCs use a bulk substrate 40 such as a monocrystalline silicon substrate. The description that follows describes the formation of the FBCs. It will be appreciated that on other regions of the substrate, logic devices such as n channel and p channel transistors can be fabricated simultaneously with the fabrication of the FBCs. Additionally, in one embodiment the FBCs are formed in a p well (shown in some of the figures below such as FIG. 1). Other wells may be used to contain the logic devices.

Figure 2:
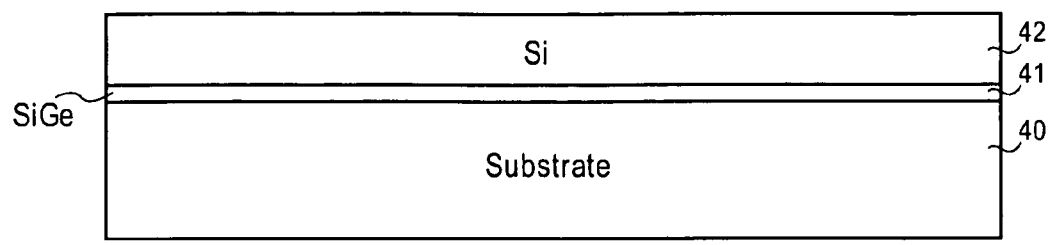
FIG. 2 is a cross-sectional, elevation view of a bulk silicon substrate having disposed thereon a silicon germanium and silicon layer.

As shown in FIG. 2, a silicon germanium layer 41 is grown on the substrate 40 using ordinary processing. The thickness of the layer 41 corresponds to the thickness desired for the back gate oxide of the FBCs. As will be seen, this layer is selectively removed and backfilled with an oxide to provide the back gate between the FBCs and the underlying back gate which comprises the p well 20 of FIG. 1. A monocrystalline silicon layer is grown on the silicon germanium layer, as shown by layer 42 of FIG. 2. The thickness of this layer corresponds to the body thickness of the FBCs, the bodies of which are formed from the layer 42. In one embodiment, silicon layer 42 and silicon germanium layer 41 may be grown selectively in the memory area only, so that the devices in the logic area are made on bulk silicon. While in the following description a system using silicon, silicon germanium silicon is described, other semiconductor materials may be used where the intermediate layer can be selectively etched without substantial etching of the layers below and above.

Figure 3:
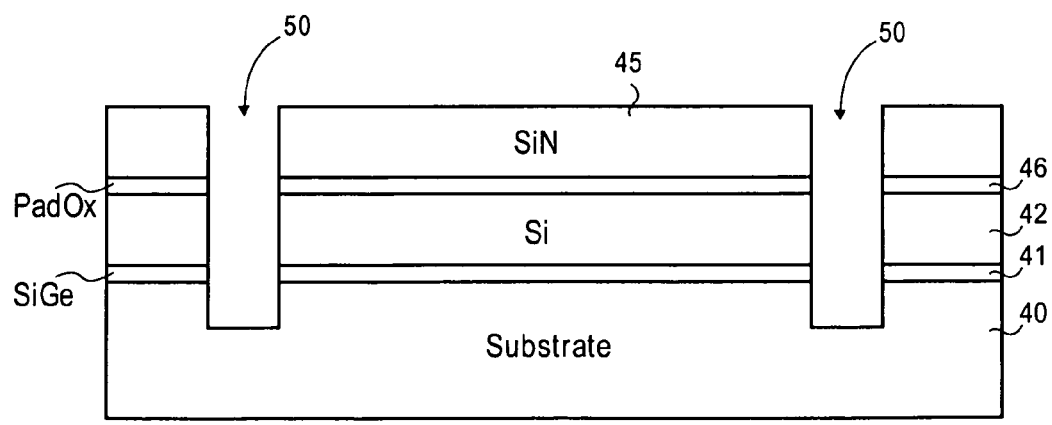
FIG. 3 illustrates the structure of FIG. 1, following photolithography processing to define openings.

A pad oxide is formed on the silicon layer 42 followed by the formation of a silicon nitride layer 45. Then, openings are formed in the silicon nitride layer which extends into the substrate 40. As will be seen, the openings 50 of FIG. 3 correspond to the locations of the anchors 30 and 31 of FIG. 1. Consequently, the distance between the openings 50 is determined by the number of gates which will be disposed between the openings, and intermediate isolation regions, if any.

Figure 4A:
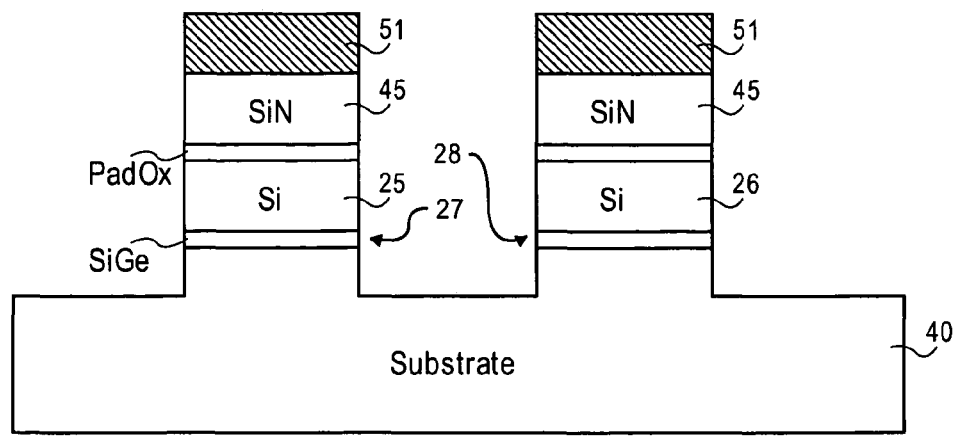
FIG. 4A illustrates the structure of FIG. 2, after an oxide anchor is formed and after silicon bodies are defined. The view is taken through section line A-A of FIG. 1.
Figure 4B:
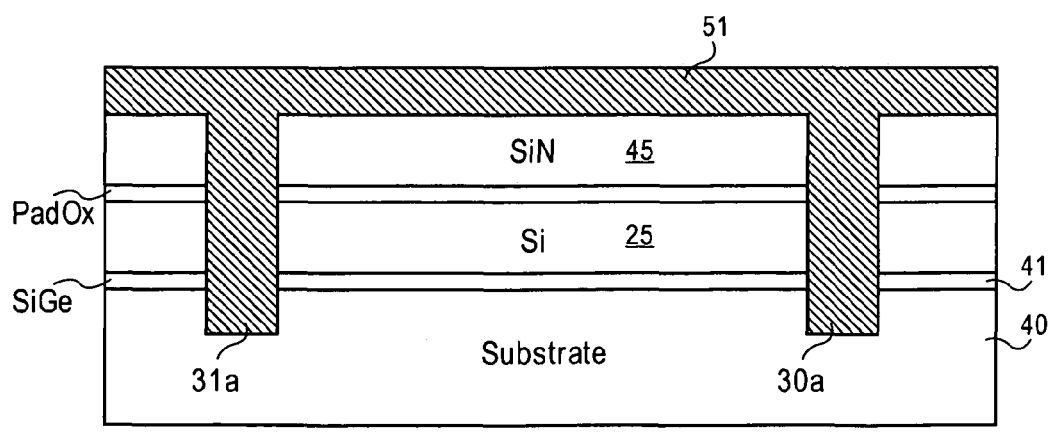
FIG. 4B illustrates the structure of FIG. 4A, however with a view through section line B-B of FIG. 1.

The depth of the openings 50 into the substrate 40 is not critical. A thin oxide growth and removal may be used to remove etch damage, particularly for embodiments where the anchors are grown from the substrate 40. For the embodiment shown in FIGS. 4A and 4B, an oxide layer 51 is deposited so as to fill the openings 50 and to form a bridge between the anchors. This oxide layer 51 is masked and etched to define the bodies 25 and 26 of FIG. 4A. In one embodiment, oxide layer 51 may be planarized prior to the patterning of the bodies 25 and 26. After the patterning, the sidewalls of SiGe 27 and 28 are exposed so that the SiGe layer can be removed with a selective etching. Note, FIG. 4A is a view taken through the section line A-A of FIG. 1, and FIG. 4B is taken through the section line B-B of FIG. 1. In FIG. 4B for the shown embodiment, the anchors are shown as 30a and 31a to identify the oxide anchors. This distinguishes these anchors from other anchors formed from silicon in another embodiment discussed later.

Figure 5A:
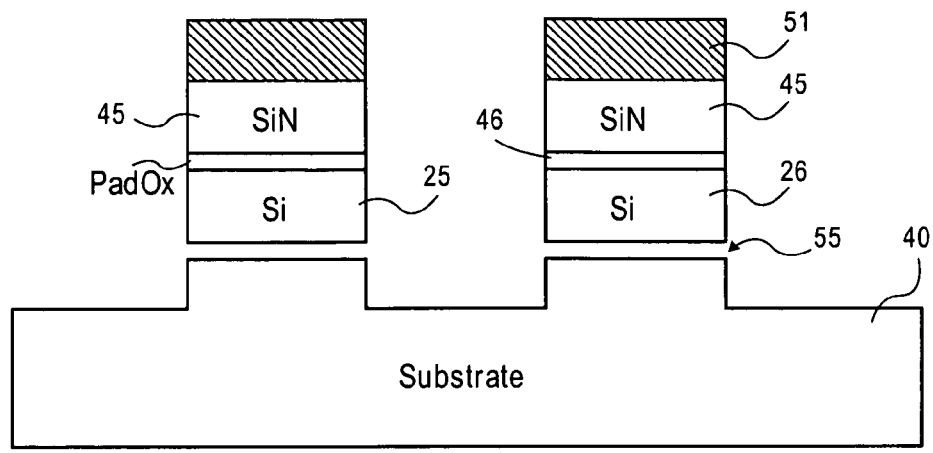
FIG. 5A shows the structure of FIG. 4A, following removal of the SiGe.
Figure 5B:
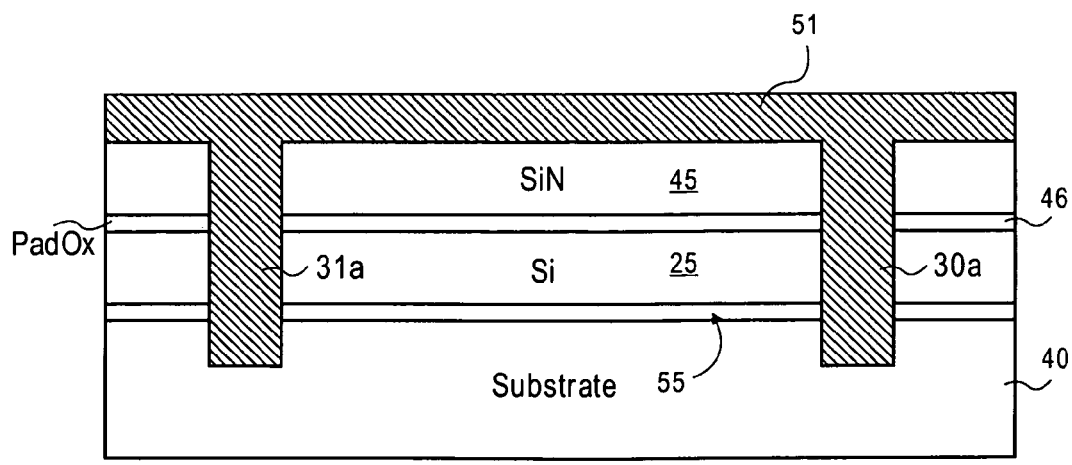
FIG. 5B shows the structure of FIG. 4B, after removal of the SiGe.

Now, as shown in FIGS. 5A and 5B, the silicon germanium is wet etched leaving the gap 55. It should be noted particularly from FIG. 5B, that the oxide 51, silicon nitride layer 45, pad oxide 46 and the body 25 form the bridge between the anchors 30a and 31a. Typically, pad oxide 46 and silicon body 25 are relatively thin while the nitride layer 45 is relatively thick to provide the mechanical strength for forming the bridge.

Figure 6A:
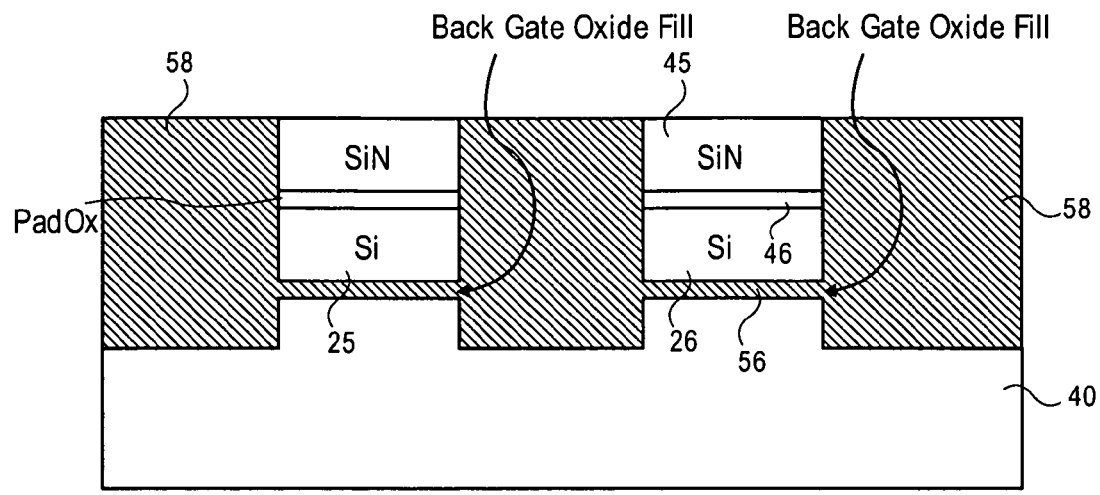
FIG. 6A illustrates the structure of FIG. 5A, after oxide filling and planarization.
Figure 6B:
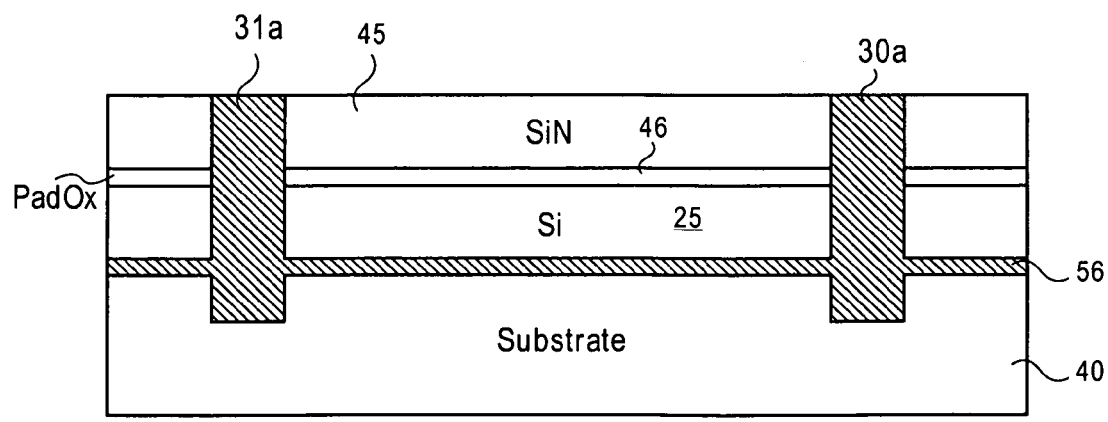
FIG. 6B illustrates the structure of FIG. 5B, after oxide filling and planarization.

Next, a dielectric is formed in the gap which, as mentioned, becomes the dielectric for the back gate of the FBCs. Thermal oxidation may be used to oxidize the silicon defining the gap, or atomic layer deposition (ALD) can be used to fill the gap with a dielectric to form the backgate oxide. The backgate oxide materials may be silicon oxide or other high-k dielectric materials such as HfOx. Shallow trench isolation oxide 58 is also deposited and planarized to provide the structure shown in FIGS. 6A and 6B. If high-k dielectric is used to fill gap, the high-k dielectric on the sidewalls of SiN/PadOx/Si may need to be removed prior to the deposition of trench oxide 58. The removal of the high-k dielectric may be beneficial for planarization around the silicon layer in the subsequent steps. As can be seen particularly well from FIG. 6A, the bodies 25 and 26 are completely electrically isolated from the underlying substrate 40. Note that in FIGS. 6A and 6B, the overlying oxide bridge 51 has been removed, its function no longer needed. The structure can be further process to remove silicon nitride layer 45, pad oxide layer 46, and planarize the diffusion layers 25, 26 and the trench oxide 58.

Figure 7A:
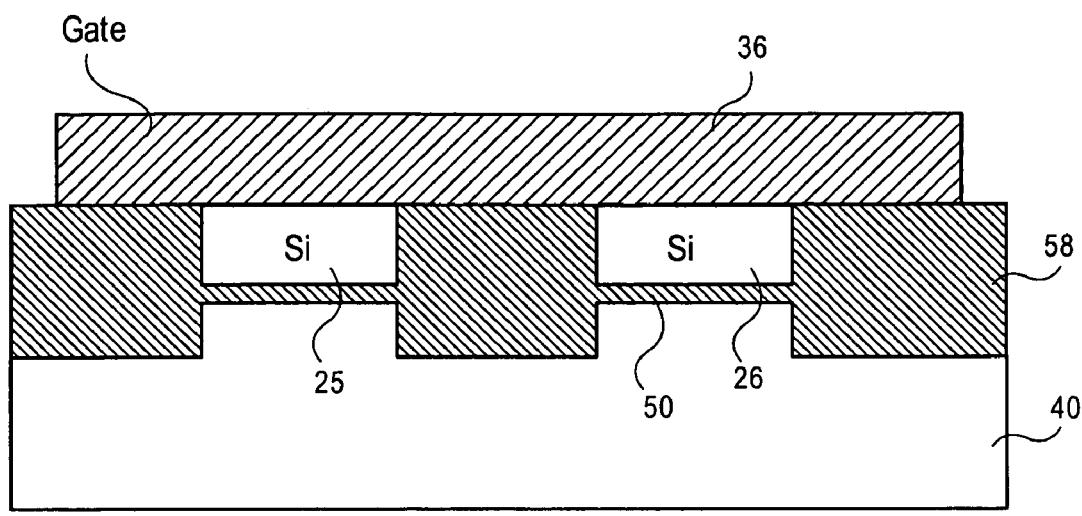
FIG. 7A illustrates the structure of FIG. 6A, following gate formation.
Figure 7B:
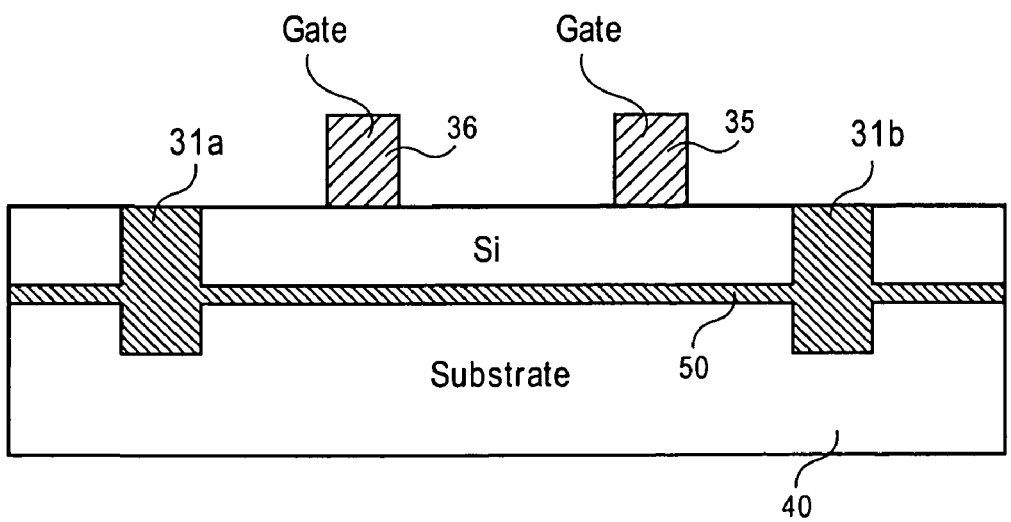
FIG. 7B illustrates the structure of FIG. 6B, after gate formation.

Now, a gate structure can be formed which includes a gate dielectric and overlying gate in an ordinary manner. This may include the formation of a high k dielectric. A replacement gate process may be used to form the gates. Gates 35 and 36 corresponding to the gates shown in FIG. 1, are shown in FIGS. 7A and 7B.

Ordinary processing may be used to complete the FBCs, including the formation of source and drain regions.

Figure 8:
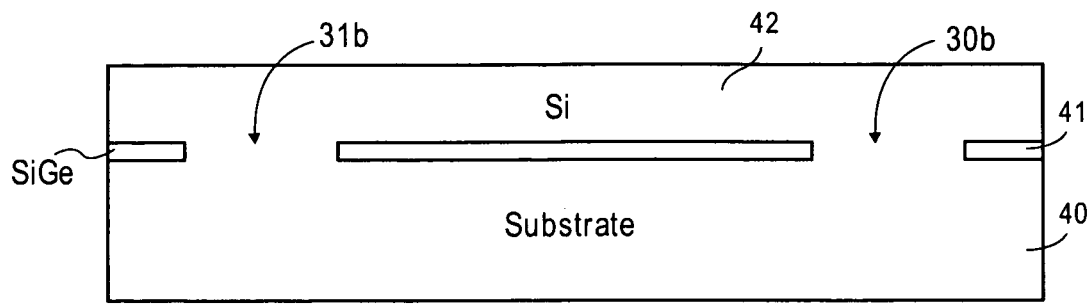
FIG. 8 illustrates the structure of FIG. 3, after an epitaxial growth of silicon and removal of masking members for alternate processing.

Referring again to FIG. 3, in an alternate embodiment, silicon is grown from the substrate 40 to fill the openings 50. Consequently, the anchors are formed from silicon rather than the oxide used in the previous embodiment. In this embodiment, the logic area may be opened up at the same time as the anchor 50 was patterned. The subsequent silicon growth will fill the logic area to allow logic devices on the bulk silicon. After removal of the silicon nitride and pad oxide, the resultant structure is shown in FIG. 8. Note the silicon anchors 30b and 31b appear integral to the underlying substrate and the overlying layer 42.

Figure 9A:
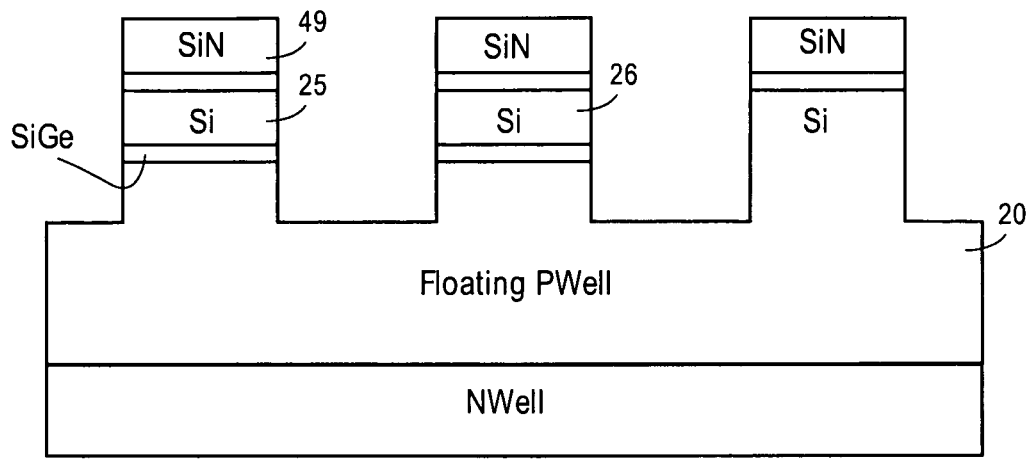
FIG. 9A is a cross-sectional, elevation view generally taken through section line A-A of FIG. 1, following the formation of silicon bodies from the wafer of FIG. 8.
Figure 9B:
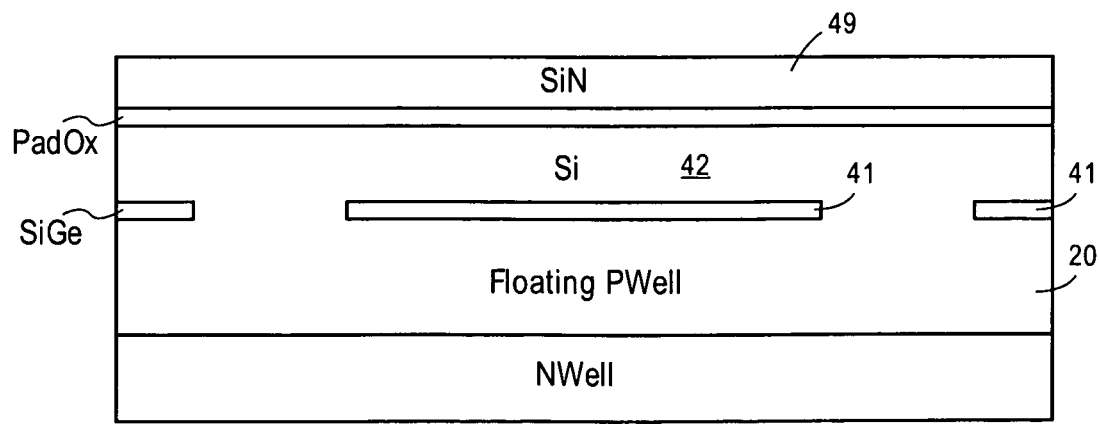
FIG. 9B shows the structure of FIG. 9A, taken through the section line B-B of FIG. 1.

Now as shown in FIGS. 9A and 9B, another pad oxide and silicon nitride layer 49 are deposited and patterned as usually done in a shallow trench isolation process defining the bodies 25 and 26 shown in FIGS. 9A and 9B. If the wafer is too flat after the silicon epi-growth, it may not be possible to align the shallow trench patterns to the pattern of the anchors. In that case, an alignment mark layer may need to be patterned separately, so that both anchor and shallow trench layers can be aligned to it. Note in these figures the well 20 formed within the underlying n well is shown.

Figure 10A:
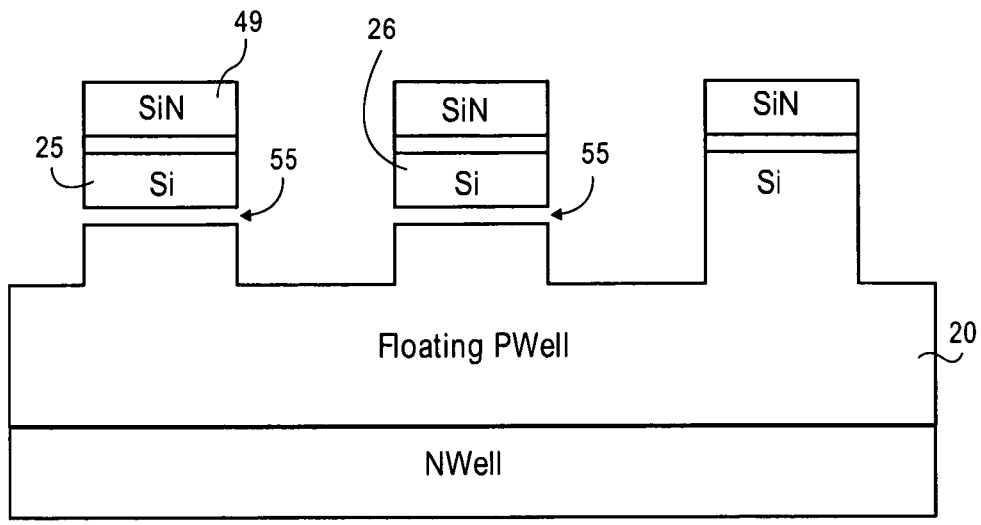
FIG. 10A illustrates the structure of FIG. 9A, following removal of the SiGe.
Figure 10B:
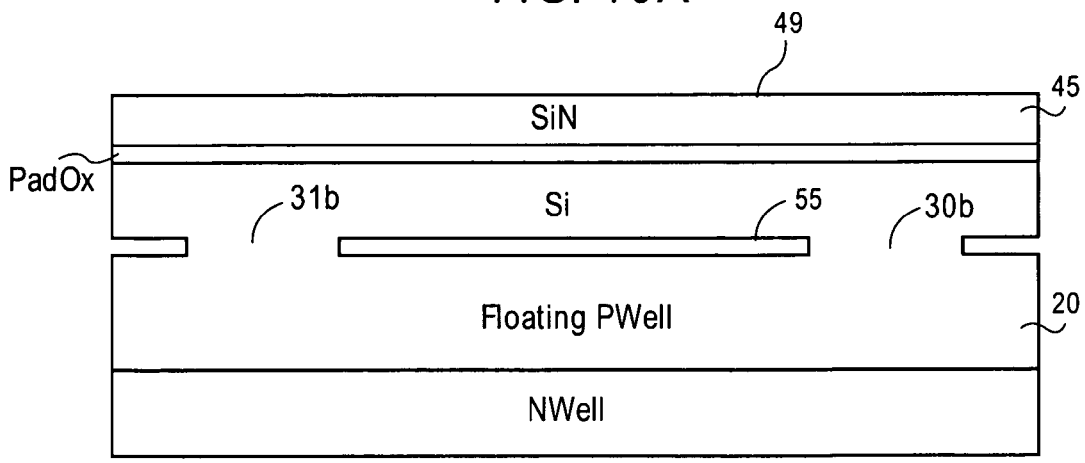
FIG. 10B illustrates the structure of FIG. 9B, following removal of the SiGe.
Figure 11A:
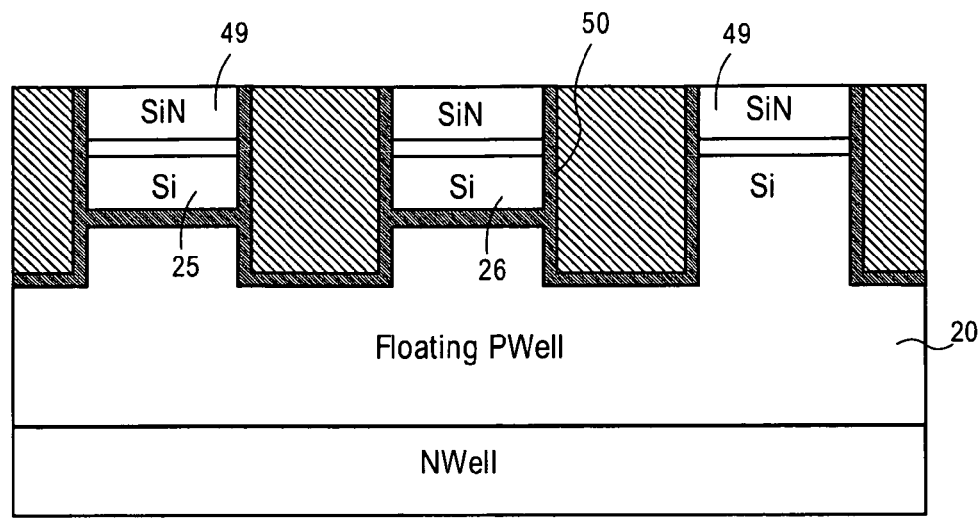
FIG. 11A illustrates the structure of FIG. 10A, following formation of a back gate insulator and trench oxide planarization.
Figure 11B:
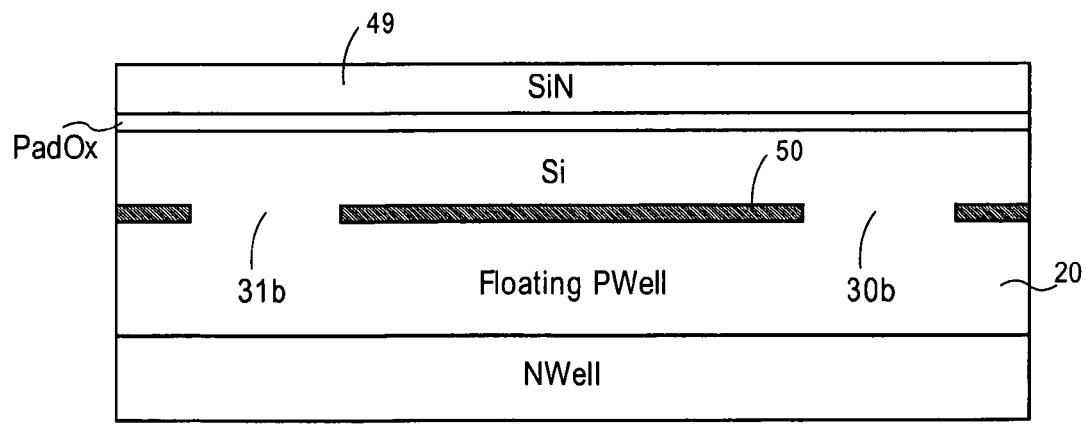
FIG. 11B illustrates the structure of FIG. 10A, taken through the section lines B-B of FIG. 1.

At this point in the processing, the silicon germanium is exposed on the sidewalls and is ready to be selectively etched. Once again, the silicon bodies 25 and 26 are free standing and anchored down by the silicon anchors 30b and 31b. The overlying silicon nitride 49 functions as a bridge, and consequently, is relatively thick. The resultant structure is shown in FIGS. 10A and 10B with the gap 55 showing the opening that forms once the silicon germanium is etched. Once the silicon germanium is removed, a thermal oxidation or ALD oxide deposition can be used to fill the air gap. Trench oxides can be deposited and planarized, as typically is done in a shallow trench isolation process with the resultant structure shown in FIGS. 11A and 11B. The back gate oxide 50 is shown between the floating p well 20 and the bodies 25 and 26. Known transistor processing may be used to form the FBCs. For instance, a high k metal gate structure may be used.

As is apparent, the anchors have an impact on array efficiency because of the area they consume. A large distance between the anchors is preferred for better efficiency. However, as mentioned, the bridge may collapse if the distance is too large. One way to alleviate this issue is to incorporate the anchors into source/drain regions where isolation from the substrate is not needed for the previously discussed embodiment. For certain array architectures, a source line is provided per word line. The sources of neighboring cells are isolated from each other. In this architecture, the space for source isolation can first be used for anchors. After the back gate oxide is formed and the freestanding silicon is reattached to the substrate by the oxide, a cut mask can be used to remove the anchors and provide isolation for the source regions.

Figure 12:
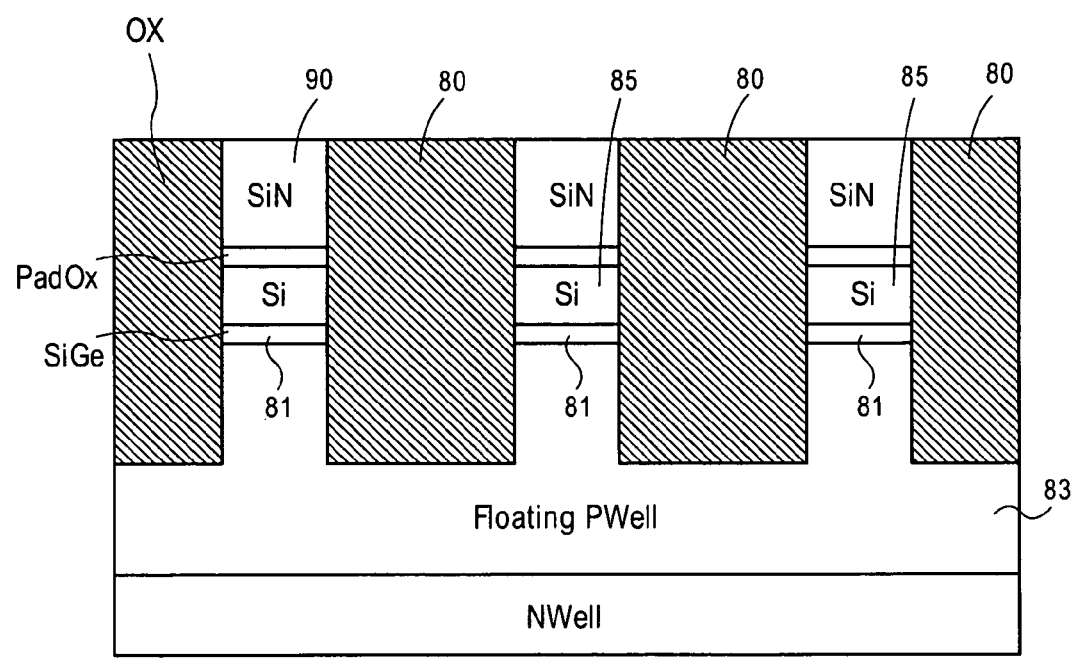
FIG. 12 is a cross-sectional, elevation view of the substrate of FIG. 4 illustrating alternate processing. This view is generally taken through the section line A-A of FIG. 1.

In yet another embodiment, processing can be used without using the anchors. Rather, a selective epitaxial silicon growth, similar to the one described in the previous embodiment, can be used forming silicon and silicon germanium in the memory areas, and silicon in the other areas for logic devices. Such a process is shown in FIG. 12 with a floating p well 83 and the bodies 85 with their underlying silicon germanium layer 81. The silicon nitride members 90 and trench oxides 80 are also shown in FIG. 12.

Figure 13A:
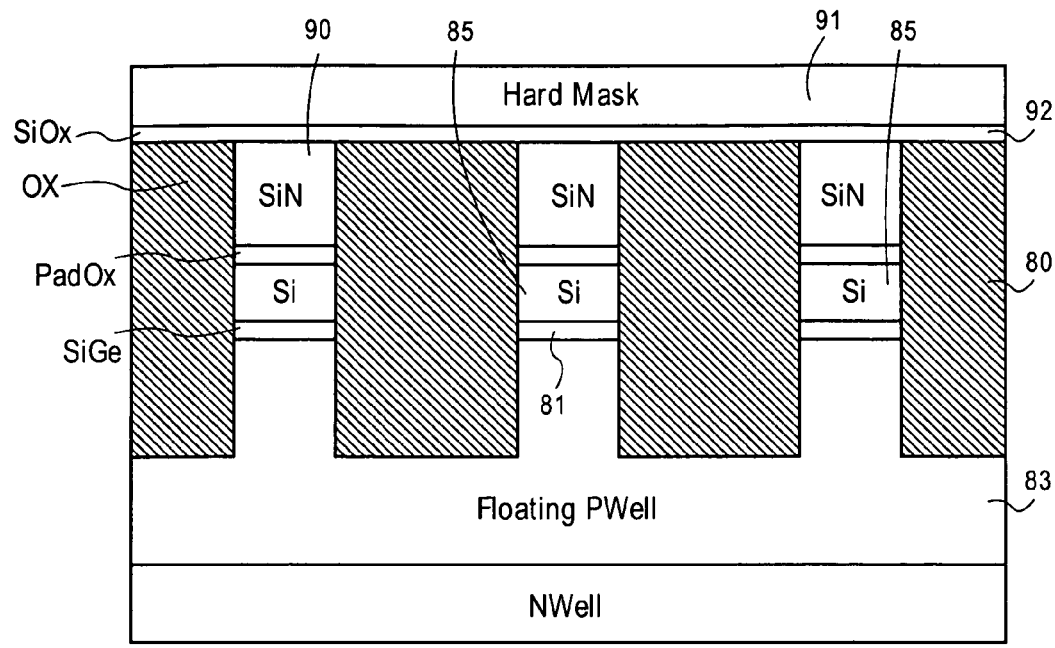
FIG. 13A illustrates the structure of FIG. 12, following formation and patterning of a hard mask.
Figure 13B:
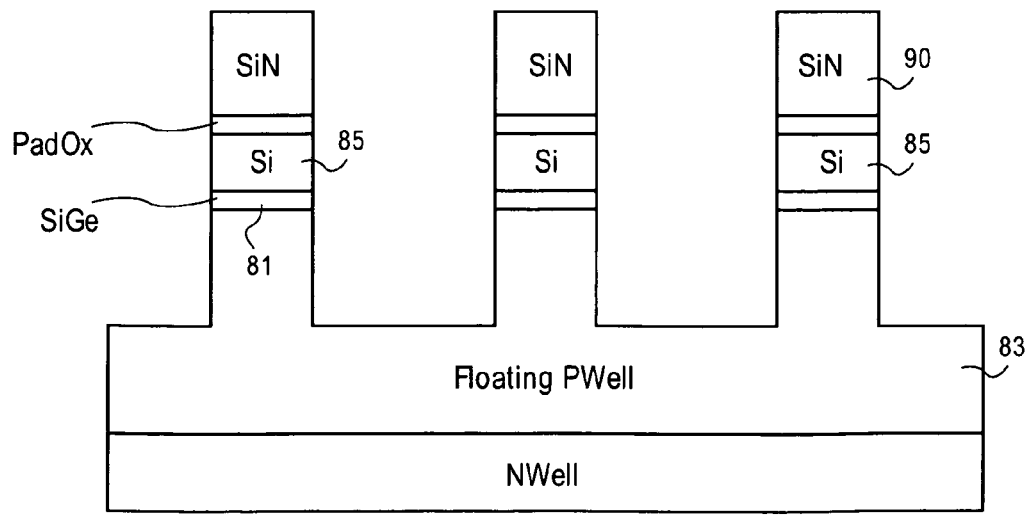
FIG. 13B illustrates the structure of FIG. 13A, viewed from the section line A'-A' of FIG. 1.

As shown in FIGS. 13A and 13B, an oxide layer and hard mask 91 are formed on the wafer. The hard mask is patterned in a direction orthogonal to the bodies (diffusion line), that is, in the gate direction of FIG. 1. The hard mask etch stops on the underlying oxide layer 92. A subsequent selective oxide etch removes the oxide 92 in the regions of the trenches. This etch is preferably a dry etch so that the trench oxide elsewhere under the hard mask lines is not removed and functions as the bridge for the silicon germanium removal.

Now, the silicon germanium can be replaced by etching it and the back gate oxide grown or deposited. ALD oxide is preferred for forming the back gate oxide to avoid non-uniform silicon consumption in the channel region. If the back oxide is thermally grown, a diffused region can define the hard mask line/space relation to gate line/space to ensure uniform channel width.

Figure 14:
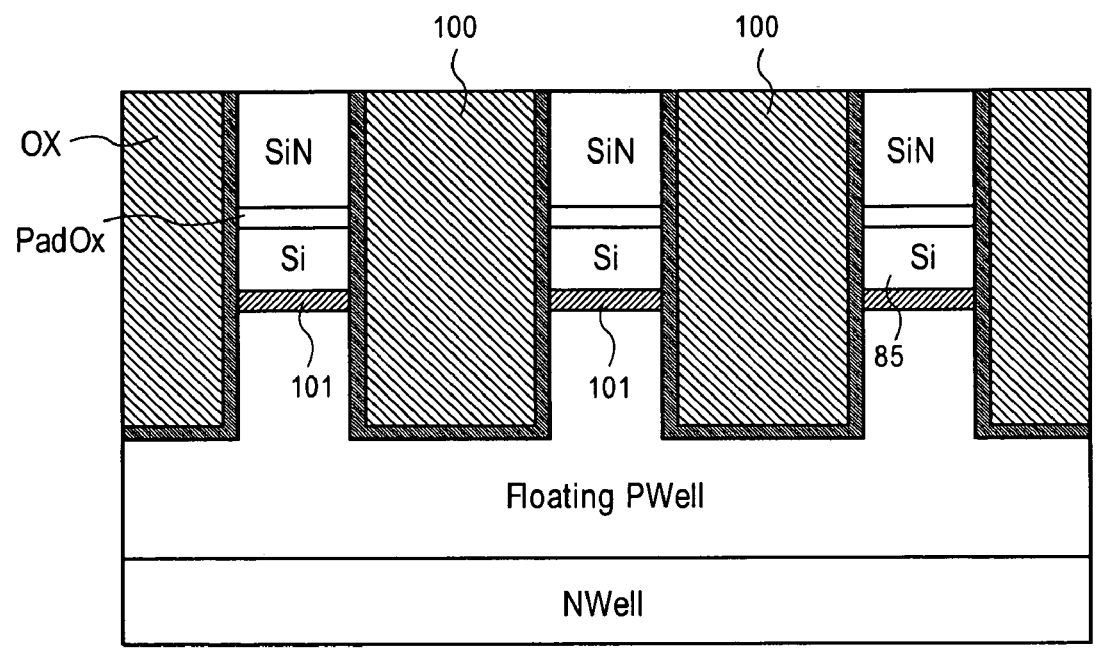
FIG. 14 illustrates the structure of FIG. 13A, following trench oxide formation and planarization.

After the back gate oxide is deposited, a second trench oxide can be deposited and planarized. The hard mask and underlying oxide layer are removed during the second planarization. The final cross-section is shown in FIG. 14. The completion of the FBCs and logic transistors can be done as described above using ordinary processing. FIG. 14 illustrates the back gate dielectric 101 which is deposited following the removal of the silicon germanium along with the newly deposited oxide 100.

Thus, a method and resultant structure for forming FBCs from a bulk substrate has been described.

What is claimed is:

1. A floating body memory comprising:
   a bulk silicon substrate;
   a plurality of parallel, spaced apart floating bodies;
   anchors disposed at the end of the bodies generally transverse to the bodies extending from the bodies into the substrate;
   a plurality of parallel, spaced-apart gates insulated from the bodies disposed generally transverse to the bodies and generally parallel to the anchors; and
   an insulating layer extending between the anchors insulating the bodies from the substrate;
   wherein the anchors are not an electrically functional element of the memory.

2. The memory of claim 1, wherein the bodies and the anchors comprise monocrystalline silicon.

3. The memory of claim 1, wherein the anchors comprise an oxide.

4. The memory of claim 1, wherein the memory is disposed within a p well formed in the bulk substrate, and the p well is disposed within an n well formed in the silicon substrate.

* * * * *